United States Patent [19]

Tanaka et al.

[11] Patent Number: 4,885,528
[45] Date of Patent: Dec. 5, 1989

[54] APPARATUS WHICH USES A SIMULATED INDUCTOR IN THE MEASUREMENT OF AN ELECTRICAL PARAMETER OF A DEVICE UNDER TEST

[75] Inventors: Hideshi Tanaka; Kazuyuki Yagi; Shigeru Tanimoto; Yasuaki Komatsu; Koichi Yanagawa; Yoichi Kuboyama, all of Hachioji, Japan

[73] Assignee: Hewlett-Packard Company, Palo Alto, Calif.

[21] Appl. No.: 318,286

[22] Filed: Mar. 3, 1989

[30] Foreign Application Priority Data

Mar. 4, 1988 [JP] Japan .............................. 63-29322[U]

[51] Int. Cl.⁴ ........................ G06G 7/62; G01R 27/00
[52] U.S. Cl. .................................. 324/57 R; 364/802
[58] Field of Search .................. 324/57 R, 158 R; 364/802

[56] References Cited

U.S. PATENT DOCUMENTS

| 3,993,968 | 11/1976 | Lee | 364/802 |
| 4,057,717 | 11/1977 | Ferry | 364/802 |
| 4,333,157 | 6/1982 | Lee | 264/802 |
| 4,364,116 | 12/1982 | Nossek | 364/802 |
| 4,383,305 | 5/1983 | Lee | 364/802 |

FOREIGN PATENT DOCUMENTS

| 714425 | 2/1980 | U.S.S.R. | 364/802 |
| 1038954 | 8/1983 | U.S.S.R. | 364/802 |

OTHER PUBLICATIONS

"A Grounded Inductance Simulation Using the DVCES/DVC/S", Proceedings of the IEEE, vol. 66, No. 9, 9/1978, pp. 1089-1091, Soliman.
"Artificial Inductance of High Quality for Low-Frequency Oscillatory Circuits", Funks Chan., vol. 51, No. 7, 3/30/79, Bergman.

Primary Examiner—Gerard R. Strecker
Assistant Examiner—Maura Regan

[57] ABSTRACT

The present invention relates to apparatus for measuring the AC electrical parameters of a circuit element (Device-Under-Test, DUT), such as a resistor, a capacitor or an inductor, at the desired frequency of a signal while applying a DC bias to the DUT. The present invention provides an apparatus capable of measurement with less error even in the lower-frequency range.

4 Claims, 4 Drawing Sheets

APPARATUS WHICH USES A SIMULATED INDUCTOR IN THE MEASUREMENT OF AN ELECTRICAL PARAMETER OF A DEVICE UNDER TEST

BACKGROUND OF THE INVENTION

1. Field of the Invention

The present invention relates to an apparatus for measuring an AC electrical parameter of a device-under-test (DUT), such as a resistor, an inductor, or a capacitor, and more particularly, to the apparatus for measuing the AC electrical parameter of the DUT using a measurement signal of desired frequency while applying a DC bias to the DUT.

2. Background of the Invention

A circuit as shown in FIG. 2 (Prior Art) has been used to measure an AC electrical parameter of a DUT. Specifically, a measurement signal (AC) source 206 is connected to one terminal of a DUT 205 with the other terminal, or point G, being connected to one terminal of a current detecting resistor $R_r$. The resistor $R_r$ forms the negative feedback circuit of an operational amplifier 203 and is coupled to one input of differential amplifier 202 via DC blocking capacitor C1. The other input terminal of this amplifier 203 is grounded; therefore, the other terminal, or point G, of the DUT 205 is virtually grounded. Accordingly, a voltage substantially equal to the voltage of the signal source is applied across the DUT 205. If a voltage $V_{AD}$ across the DUT 205 is picked up by a differential amplifier 201 and another voltage $V_{AR}$ across the resistor $R_r$ by another differential amplifier 202, it is possible to obtain the AC impedance of the DUT 205 in accordance with $(Rr)(V_{AD}/V_{AR})$; where $V_{AD}$ and $V_{AR}$ are in the form of a vector voltage.

When performing the AC electrical parameter measurement of the DUT 205 by providing a coupling circuit 207 between the signal source 206 and the DUT 205, connecting a DC bias source 208 (which is a voltage source or a current source with one terminal grounded) to this coupling circuit to apply a DC bias to the DUT 205, and using a desired frequency, if the DUT 205 has a high impedance, the value of the resistor $R_r$ is made large to enhance the sensitivity of current detection. But, the output of the DC bias source 208 must be limited within the range where the amplifier 203 cannot be saturated, so that it is impossible to impose a large DC bias on the DUT 205.

To solve the foregoing problem, a circuit as shown in FIG. 1 (Prior Art) has been used.

In this drawing, one terminal G of the DUT 205 is connected to the resistor $R_r$ via a DC blocking capacitor 212 and to an AC blocking inductor 211 which forms the return path of the DC bias source 208. In this circuit, if the frequency of the measurement signal source 206 is low, the capacitor 212 must have a sufficiently large capacitance, especially if the inductor 211 has no sufficiently large impedance in low-frequency measurement, since the result of measurement involves error. This error increase with increasing resistance $R_r$. On the contrary, if the inductance is small, the equivalent input noise of the amplifier 203 is amplified in a low-frequency range, and further, if the DC resistance of the inductor 211 is large, this causes a DC offset at point G. As a result, an error is involved in the DC bias voltage being imposed disadvantageously on the DUT 205. Accordingly, in the measurement of low-frequency range, the inductor 211 must have a high inductance and a low DC resistance. Hence, the circuit design is difficult to achieve.

A third circuit (not shown) has also been known where current sources $I_{BS}$ and $I_{BR}$ of opposite polarity but the same current value are connected to the coupling circuit 207 and the point G, respectively. The bias current flowing into the DUT 205 from, for example, the $I_{BS}$ is taken out by means of the $I_{BR}$ so that the DC bias current cannot flow through the resistor $R_r$. This circuit has drawbacks in that the mechanism of performing the tracking of the two current values becomes complicated; the DC bias current tends to leak to a ground terminal within the DUT and such a leak breaks the balance of current, so that an unbalanced current inevitably flows into the resistor $R_r$.

SUMMARY OF THE INVENTION

It is an advantage of the present invention to provide a measuring apparatus which simulates an inductor having a sufficiently large AC impedance, even in a low-frequency range, and small DC resistance, and causes only a small error of measurement when measuring the AC electrical parameter of a DUT while applying a high DC bias thereto.

According to the present invention, an inductor having a high impedance even in a low-frequency range and a low DC resistance is artificially formed by an electronic circuit. By replacing the inductor 211 shown in FIG. 1 with the thus formed simulated inductor, it is possible when measuring the AC impedance or electrical parameter of a DUT while applying a high DC bias thereto to realize very precise measurement with little error and slight noise influence.

In accordance with the preferred embodiment of the invention, an inductor having a high impedance even in the low-frequency range and a low DC resistance is simulated formed by an electronic circuit, as shown in FIG. 3(a).

By replacing an inductor 211 shown in FIG. 1 with the thus formed simulated inductor, the measurement error due to the low impedance of the inductor 211 in the low-frequency range and the measurement error due to the DC offset caused by a high DC resistance are prevented. The input equivalent noise of an amplifier 203 is also prevented to be amplified by the amplifier 203. Thus, the high precision measurement of the AC electrical parameters of the DUT can be obtained.

High DC bias voltage can be applied to the DUT due to the DC blocking operation of a capacitor 212.

DETAILED DESCRIPTION OF THE INVENTION

Figure 3A:
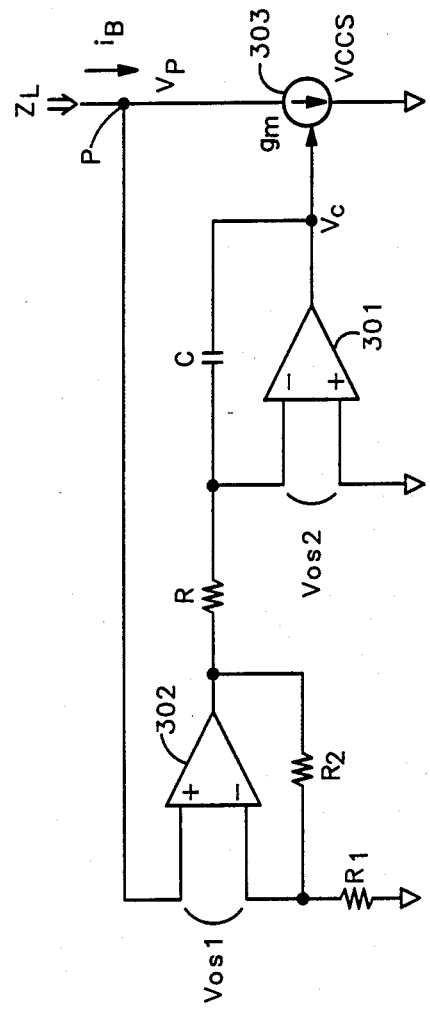
FIG. 3(a) is a schematic diagram showing the configuration of a simulated inductor according to an embodiment of the present invention and its equivalent.
Figure 3C:
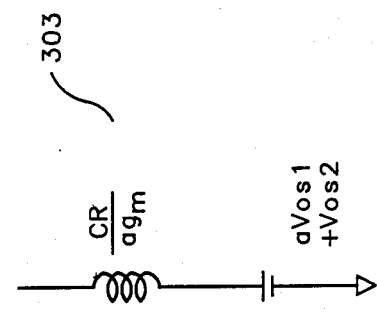
FIG. 3(c) is an example for source 303 in FIG. 3(a).
Figure 3B:
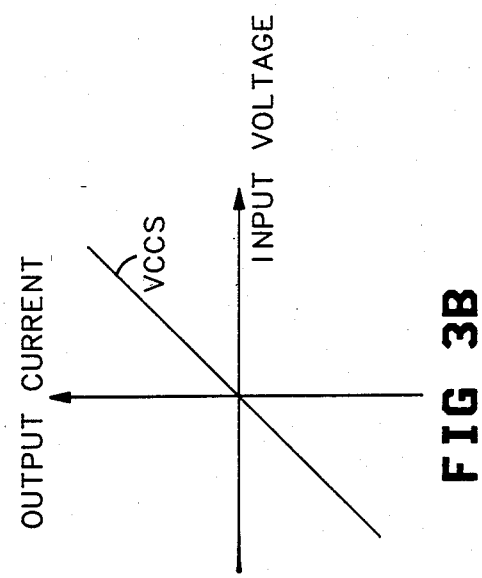
FIG. 3(b) is a diagram showing the general relationship between input voltage and output current of VCCS 303 in FIG. 3(a).

An embodiment of a simulted inductor according to the present invention is shown in FIG. 3. In this drawing, a point P is one to be connected to the point G showing in FIG. 1. The point P is connected to the non-inverting input terminal of a non-inverting amplifier 302 having a high input impedance and to the output terminal of a voltage controlled current source (VCCS) 303 having a high output impedance. A voltage $V_P$ at the point P is amplified in the amplifier 302 by a factor of $(1+R_2/R_1)$ and sent though a resistor R to an integrator 301 having an integrating capacitor C in its feedback loop. The output of the integrator 301 is applied to the VCCS 303 to control the output current thereof. Consequently, the point P is virtually grounded even in a direct current mode, and its potential is substantially equal to the ground potential. Assuming that the relationship between input voltage and output current of the VCCS 303 is shown in FIG. 3(b); in FIG. 3(a), $$i_B = (V_P)(a)(1/j\omega CR)(g_m)$$

where $a = 1 + R_2/R_1$;
$g_m = \Delta i_B/\Delta V_c$ (conductance); and
$\omega$ is an angular frequency.

Accordingly, the impedance $Z_L$ of the simulated inductor formed by the foregoing circuit is:

$$Z_L = V_P/I_B = j\omega CR/(a\ g_m) = j\omega(CR)/(a\ g_m)$$

thus, the inductance L of the inductor becomes:

$$L = CR/(a\ g_m)$$

Further, a DC error voltage (or a DC offset voltage) $V_{PE}$ at the point P is:

$$V_{PE} = a(V_{OS1}) + (V_{OS2})$$

where $V_{OS1}$ and $V_{OS2}$ are the input offset voltages of the amplifiers 302 and 301, respectively.

Thus, the equivalent circuit of the simulated inductor according to the present invention is shown in FIG. 3(a).

With the foregoing configuration, the error of the DC bias voltage imposed on the DUT 205 depends only on the DC error voltage $V_{PE}$ caused by the input offset voltages of the amplifiers 302 and 301 at the point P. Therefore, if very precise operational amplifiers of small input offset voltage are employed, the $V_{PE}$ can be made small. Consequently, the equivalent DC resistance of the simulated inductor can be made significantly small. If the current absorbed by the VCCS 303 is assumed to be 1 A and the DC error voltage $V_{PE}$ to be 1mV, the equivalent DC resistance of the simulated inductor becomes 1 m ohm. Although the inductance depends on $g_m$ other than C and R, this $g_m$ is limited by the workable voltage range of the integrator 301 and of the VCCS 303. If it is intended to control $\pm$-50mA by a voltage of, for example, $\pm$-5 V, the $g_m$ becomes 10mS. If the range is of such a degree as above, an inductance of the order of 10H can be realized, and a small-sized simulated inductor can be formed which has a high inductance and a low DC resistance as compared with a conventional choke coil. With this, therefore, in low-frequency measurement, the measurement error and the adverse influence of noise, which would result from the inductor 211 of FIG. 1 having a low inductance, can be remarkably improved.

The speed of response of the AC electrical parameter measuring system can be enhanced if the inductance of the simulated inductor immediately after the applying of the DC bias to the system is made lower than in the steady state (at the time of the AC electrical parameter measurement). This can be achieved by, for example, changing or switching the value of the resistor R of FIG. 3(a). The method of such switching is well known to those skilled in the art.

Figure 4B:
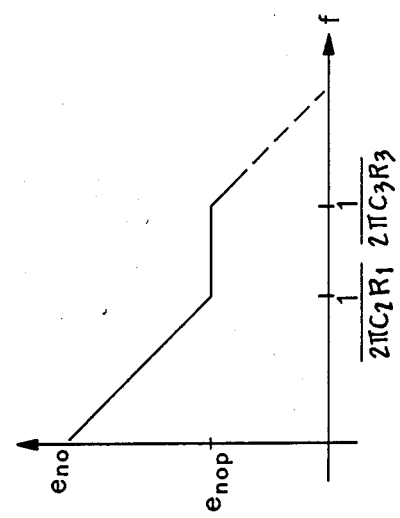
FIG. 4(b) is a diagram showing the relationship between signals $I_o$ and VCTL of FIG. 4(a).
Figure 4A:
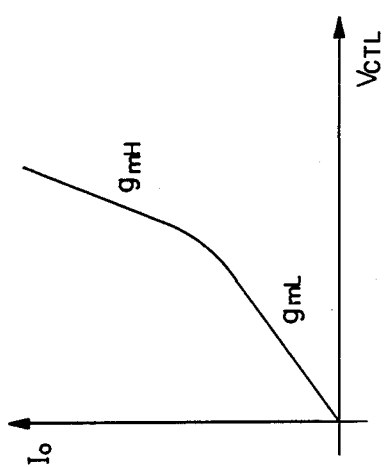
FIG. 4(a) is a schematic diagram showing an embodiment of a VCCS used in the simulated inductor.

FIG. 4(a) is a fragmentary diagram of an embodiment of the VCCS 303 used in reducing the noise output from the simulated inductor itself, showing a current draw-out section. This circuit is used in such a manner that where the drawn-out/drawn-in current due to the simulated inductor is enough even if it is small; the $g_m$ of the VCCS 303 is switched to a smaller one to lessen the influence of a voltage noise generated in stages preceding the VCCS, thereby reducing the output current noise. In this circuit, if the drawn-out current decreases, a transistor $Q_3$ turns off, so that the $g_m$ ($=\Delta I_o/\Delta V_{CTL}$) decreases from $g_{mH} = R_2(R_4 + R_5 + R_6)/((R_1)(R_6)(R_4 + R_5))$ to $g_{mL} = R_2/(R_1(R_4 + R_5))$. The foregoing feature of operation is shown in FIG. 4(b).

Figure 5B:
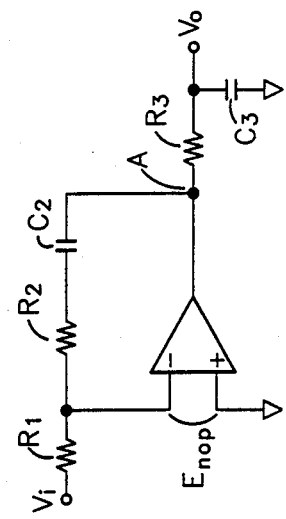
FIG. 5(b) is a diagram showing the relationship between signals en and f of FIG. 5(a).
Figure 5A:
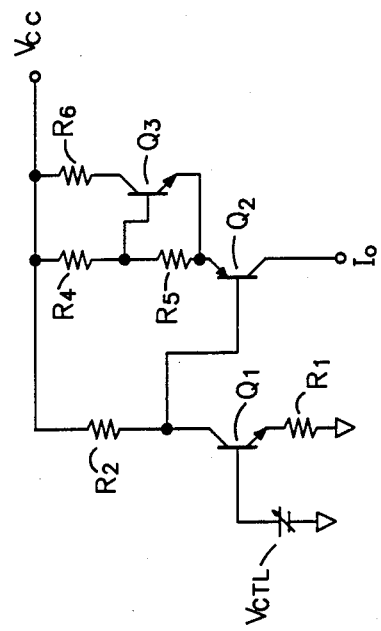
FIG. 5(a) is a schematic diagram showing an embodiment of an integrator used in the simulated inductor.

FIG. 5(a) is a diagram showing an embodiment of the integrator 301 used to reduce a voltage noise input to the VCCS 303. This circuit is configured principally so as to reduce a voltage noise generated in the amplifier forming the integrator 301 by means of a low-pass filter made of $R_3$ and $C_3$. The input/output transfer characteristic of the integrator is shown in FIG. 5(b), provided that $R_1 >> R_2$, $C_2R_2 = C_3R_3$.

Figure 1:
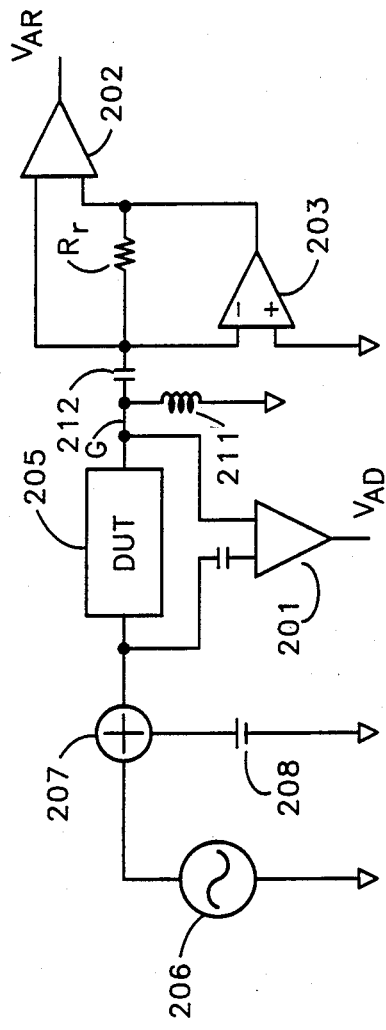
FIGS. 1 and 2 are schematic diagrams showing the simplified circuits of conventional AC electrical parameter measuring apparatus.
Figure 2:
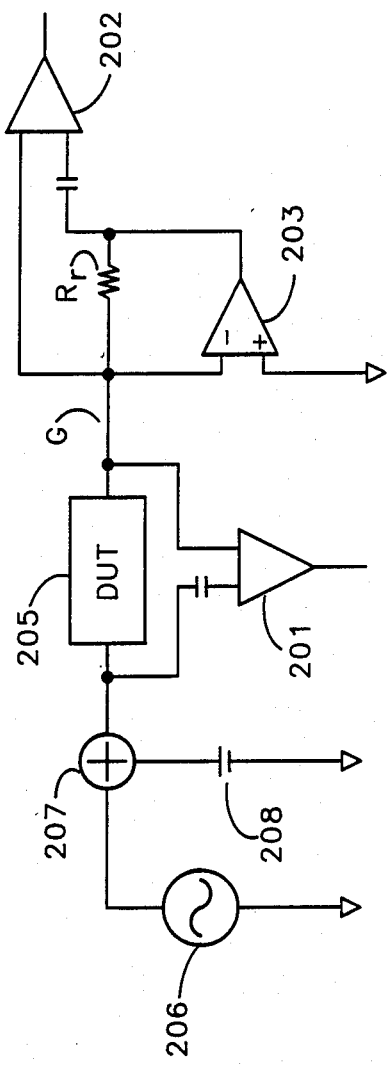
Figure 6:
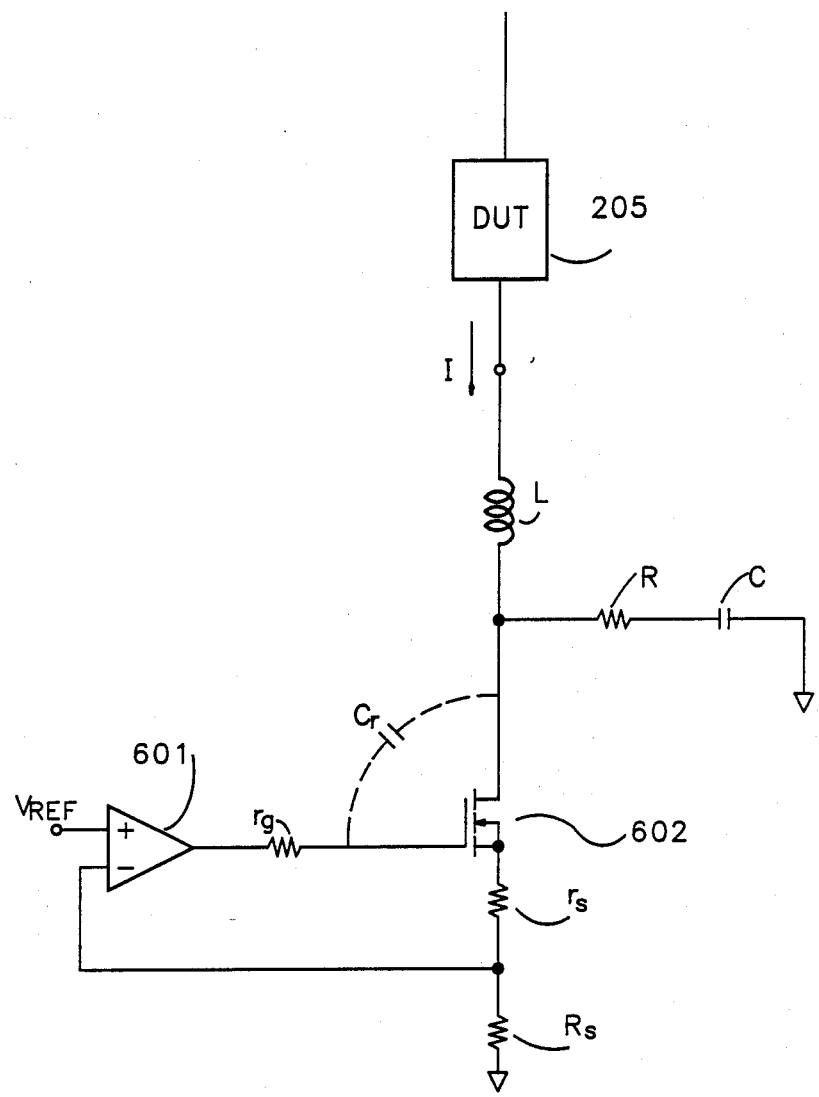
FIG. 6 is a schematic diagram showing an embodiment of a DC current source used in the production of a DC bias.

FIG. 6 is a diagram showing an embodiment of the DC bias current source being connected to the coupling circuit 207 of FIG. 1. This circuit is configured, in contrast with the conventional circuit, such that an inductor L is inserted between the DUT 205 and MOS FET 602, and a series circuit made of resistor R and capacitor C is added to the drain terminal of the FET 602, so that the stability of an output impedance, output current noise and loop as viewed from the side of the DUT 205 is improved. Since the loop, made of the operational amplifier 601 and the FET 602 operates in such a manner that the voltage across a current detecting resistor $R_S$ which is created by the DC bias current I flowing through the DUT 205 becomes equal to a DC reference voltage $V_{REF}$, the DC bias current 1 is determined by $I = V_{REF}/R_S$. Reference symbols $r_g$, $r_s$ and $C_r$ designate a gate input resistance, a source resistance and a drain-gate capacitance respectively. It is common practice that the voltage gain $G_V$ due to the FET 602 in the conventional circuit is represented by $G_V = Z_{DUT}/(R_S + r_S)$ (where $Z_{DUT}$ is the impedance of the DUT 205). Therefore, if the $G_V$ is large, a capacitance of $(G_V)(C_r)$ is seemingly added to the capacitance $C_r$ in parallel because of the mirror effect. Accordingly, it was infeasible to make the output impedance in a high-frequency range large. The inductor L is employed to make the output impedance as viewed from the side of the DUT 205 large, and the R-C series circuit serves as to reduce a current noise, which is split from the output current noise and enters the DUT 205, and to compensate for the instability of the loop resulting fro a first-order lag due to the amplifier 601 and another first-order lag due to $R_g$ and $C_r$. Since the $G_V$ due to the FEt 602 is $G_V = R/(R_S + r_S)$ at most and the mirror capacitance of $(G_V)(C_r)$ cannot take more than a certain value, the phase compensation range of the control loop is narrowed whereby compensation can be easily achieved.

As described above, by the use of the present invention, when measuring the AC impedance or electrical parameter of the DUT while applying a high DC bias thereto, very precise measurement with little error and slight noise influence can be easily achieved.

What is claimed is:

1. An apparatus for measuring the AC electrical parameters of a circuit device under test, comprising:
   an AC signal source means for applying an AC signal coupled to one terminal of said device under test;
   a DC bias source means for applying a DC bias coupled to the one terminal of a device to be tested, the DC bias source means including
   a transistor,
   an operational amplifier whose non-inverting input, inverting input and output are coupled to a reference voltage source, an emitter and a base of said transistor, respectively,
   first resistor coupled to said emitter,
   serial circuit including second resistor and capacitor being coupled to a collector of said transistor, and
   an inductor coupled between a load and said collector;
   an AC voltage measurement means coupled for measuring the AC voltage across the device under test;
   a simulated inductor means coupled to another terminal of the device under test; and
   an AC current measurement means coupled for measuring the AC current through the device under test.

2. An apparatus for measuring the AC electrical parameters of a circuit device under test, the circuit device under test having a first terminal and a second terminal, the apparatus comprising:
   an AC signal source means for applying an AC signal coupled to the first terminal of the circuit device under test;
   a DC bias source means for applying a DC bias coupled to the first terminal of the circuit device under test;
   an AC voltage measurement means coupled for measuring the AC voltage across the circuit device under test;
   a simulated inductor means coupled to the second terminal of the device under test, the simulated inductor including
   a non-inverting amplifier having a first input coupled to the second terminal of the circuit device under test,
   an integrator having an input coupled to an output of the non-inverting amplifier, and
   a voltage controlled current source having a control input coupled to an output of the integrator and having a current input coupled to the second terminal of the circuit device under test; and,
   an AC current measurement means, coupled for measuring the AC current through the circuit device under test.

3. The apparatus as set forth in claim 2, wherein the DC bias source means comprises:
   an inductor coupled to the first terminal of the circuit device under test;
   FET means, having a current input coupled to the inductor, a current output, and a control input, for varying resistance from the current input to the current output based on a voltage value on the control input.

4. An apparatus as in claim 3 wherein the DC bias source means additionally comprises:
   a reference resistance coupled in series with the current output of the FET means and to a ground; and,
   an operational amplifier with an OP AMP output coupled to the control input of the FET means, a first OP AMP input coupled to a reference voltage and a second OP AMP input coupled to the reference resistance.

* * * * *